(12) United States Patent
Albach et al.

(10) Patent No.: US 9,293,891 B2
(45) Date of Patent: Mar. 22, 2016

(54) DEVICE FOR MANAGING HEAT IN AN OPTICAL ELEMENT, AND RELATED HEAT-MANAGEMENT METHOD

(75) Inventors: Daniel Albach, Palaiseau (FR); Jean-Christophe Chanteloup, Saclay (FR); Antonio Lucianetti, Prague 2 (CZ); Thierry Novo, Saint Remy Les Chevreuse (FR); Bernard Vincent, Gif Sur Yvette (FR)

(73) Assignee: Ecole Polytechnique, Palaiseau (FR)

( * ) Notice: Subject to any disclaimer, the term of this patent is extended or adjusted under 35 U.S.C. 154(b) by 0 days.

(21) Appl. No.: 14/112,458

(22) PCT Filed: Apr. 18, 2012

(86) PCT No.: PCT/FR2012/050850
§ 371 (c)(1),
(2), (4) Date: Oct. 17, 2013

(87) PCT Pub. No.: WO2012/172213
PCT Pub. Date: Dec. 20, 2012

(65) Prior Publication Data
US 2014/0036946 A1    Feb. 6, 2014

(30) Foreign Application Priority Data
Apr. 18, 2011 (FR) .................................... 11 53358

(51) Int. Cl.
*H01S 5/024* (2006.01)
*H01S 3/04* (2006.01)
(Continued)

(52) U.S. Cl.
CPC ............ *H01S 5/02407* (2013.01); *H01S 3/042* (2013.01); *H01S 3/0404* (2013.01); *H01S 3/0604* (2013.01); *H01S 3/0621* (2013.01); *H01S 3/0625* (2013.01); *H01S 3/08072* (2013.01)

(58) Field of Classification Search
CPC ... H01S 5/02407; H01S 3/0404; H01S 3/042; H01S 3/0604; H01S 3/0621; H01S 3/0625; H01S 3/08072
USPC ................................................ 372/21, 34, 36
See application file for complete search history.

(56) References Cited

U.S. PATENT DOCUMENTS 3,679,999 A    7/1972   Chernoch
5,363,391 A *  11/1994  Matthews et al. ............... 372/36
(Continued)

FOREIGN PATENT DOCUMENTS

CN    1768413 A    5/2006
CN    101473060 A  7/2009
(Continued)

OTHER PUBLICATIONS

Y Demirel and C. Saxena, "Heat Transfer Through a Low-Pressure Gas Enclosure as a Thermal Insulator: Design Considerations" International Journal of Energy Research, vol. 20, pp. 327-338, 1996.
(Continued)

*Primary Examiner* — Armando Rodriguez
(74) *Attorney, Agent, or Firm* — Greer, Burns & Crain, Ltd.

(57) ABSTRACT

A device is provided for managing heat in an optical element, including: the optical element; a material at a reference temperature; and an intermediate gas layer located directly between the reference-temperature material and the optical element, the intermediate gas layer being located on at least a portion of the thickness thereof in a temporary diffusion state defined by a thickness of the intermediate gas layer, such that the ratio of the mean free path of the gas molecules in the intermediate gas layer over said thickness is between 0.1 and 10. The thickness of the intermediate gas layer is between 10 μm and 5 mm. A corresponding heat-management method is implemented in the device for managing the temperature of an optical element.

15 Claims, 4 Drawing Sheets

(51) Int. Cl.
*H01S 3/042* (2006.01)
*H01S 3/06* (2006.01)
*H01S 3/08* (2006.01)

(56) References Cited

U.S. PATENT DOCUMENTS

| | | | |
|---|---|---|---|
| 5,546,416 A | 8/1996 | Basu | |
| 7,200,161 B2 * | 4/2007 | Vetrovec | 372/70 |
| 2007/0297469 A1 | 12/2007 | Brown | |

FOREIGN PATENT DOCUMENTS

| | | |
|---|---|---|
| DE | 3522443 | 1/1987 |
| JP | H06-029595 A | 2/1994 |
| JP | H08-250472 A | 9/1996 |
| JP | H10-112448 A | 4/1998 |
| JP | H11-504760 A | 4/1999 |
| JP | 2006060159 A | 3/2006 |
| WO | 2004088732 A1 | 10/2004 |

OTHER PUBLICATIONS

English Translation of Search Report for Chinese Patent Application No. 201280024351.5 dated Mar. 19, 2015.
Satomura, English Translation of Office Action for JP 2014-505702 Issued Dec. 15, 2015.
Zhou, English Translation of Office Action for CN 201280024351.5 Issued Jan. 19, 2016.

* cited by examiner

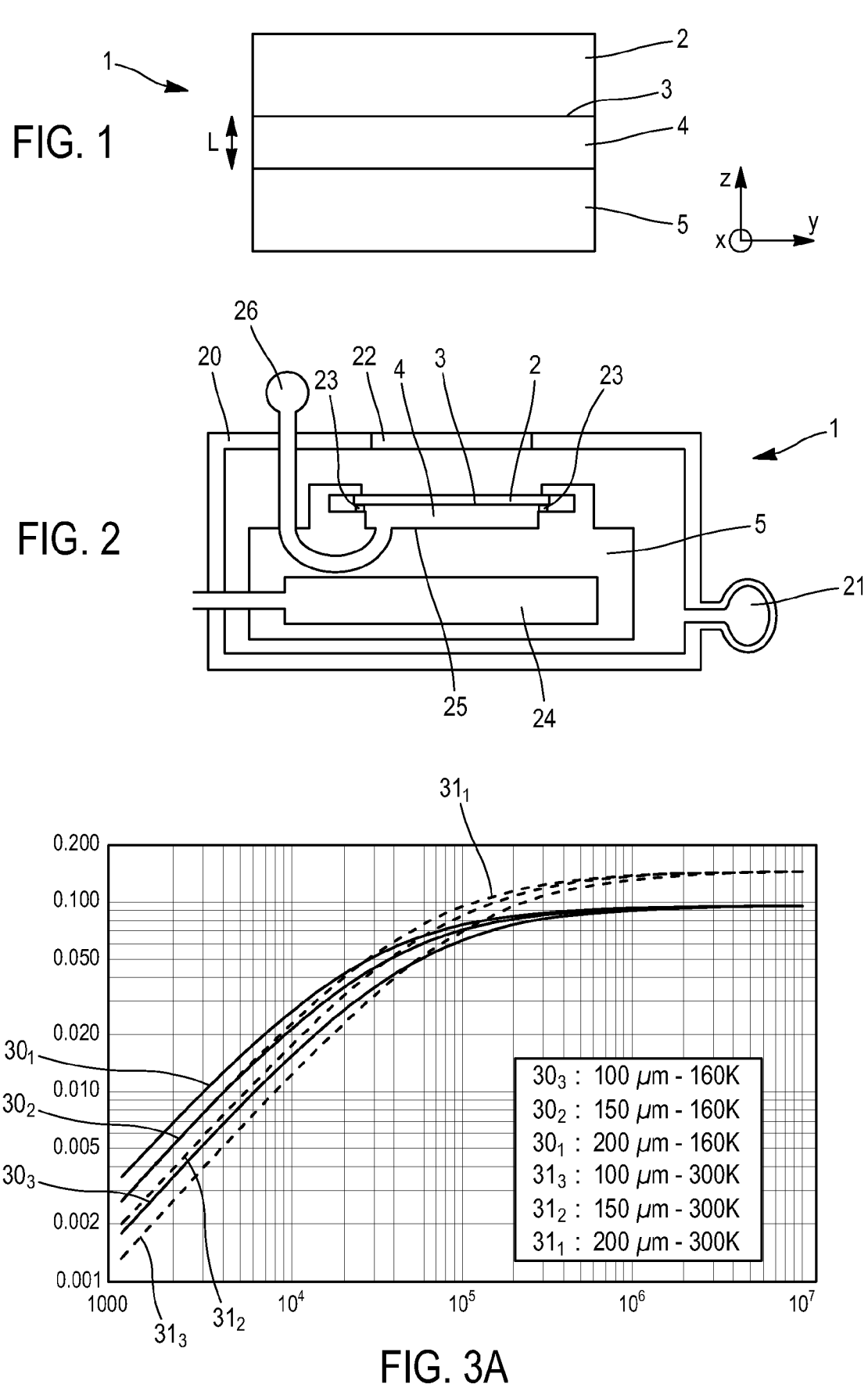

DEVICE FOR MANAGING HEAT IN AN OPTICAL ELEMENT, AND RELATED HEAT-MANAGEMENT METHOD

TECHNICAL FIELD

The present invention relates to a device for the thermal management of an optical element.

It also relates to a method of thermal management associated with said device, for managing the temperature of an optical element.

The field of the invention is in particular, but non-limitatively, that of the cooling of a solid-state laser used for producing a continuous beam or light pulses.

BACKGROUND

A device for the thermal management of an optical element, comprising a gain medium (optical element) cooled by partial immersion in a bath of liquid nitrogen, is known in the prior art.

A drawback of this device is that it does not offer any possibility of temperature adjustment, the temperature being fixed solely by the temperature of the liquid nitrogen.

A device for the thermal management of an optical element comprising a plate-shaped gain medium (optical element), functioning in transmission, cooled on either side by a high-velocity helium flow, at ambient temperature (about 300 degrees kelvin (K)), is also known in the prior art.

A drawback of this device is that the helium jet pressure is likely to cause deterioration of the gain medium as well as any reflective treatment deposited on the contact surface between the gain medium and the helium flow.

Another drawback of this device is its mechanical instability, as the gas jets cause vibrations of the whole device.

Another drawback of this device is that it requires a heavy infrastructure, in particular with the provision of a system for circulating helium at high pressure.

A device is also known in the prior art for the thermal management of an optical element, in which a cold source formed by a copper plate maintained at a desired temperature is glued to a gain medium for cooling it.

A drawback of this device is that the layer of glue between the gain medium and the cold source is likely to absorb a fraction of the laser light, to heat up in consequence, and then cause deterioration of the gain medium as well as any reflective treatment that might have been deposited on the contact surface between the gain medium and the layer of glue.

Another drawback of this device is that the layer of glue between the gain medium and the cold source can alter (through chemical or mechanical effects) the gain medium as well as any reflective treatment that might be deposited on the contact surface between the gain medium and the layer of glue.

SUMMARY

A purpose of the present invention is to propose a device for the thermal management of an optical element, and an associated method of thermal management, which do not have the drawbacks of the prior art.

In particular, a purpose of the present invention is to propose a device for the thermal management of an optical element, and an associated method of thermal management, such that the optical element as well as an optional treatment deposited on said material are not degraded.

Another aim of the present invention is to propose a device for the thermal management of an optical element, and an associated method of thermal management, permitting adjustment of the temperature of the optical element.

Another aim of the present invention is to propose a device for the thermal management of an optical element, and an associated method of thermal management, which are simple and inexpensive to implement.

Another aim of the present invention is to propose a device for the thermal management of an optical element, and an associated method of thermal management, such that high mechanical stability is obtained.

Another aim of the present invention is to propose a device for the thermal management of an optical element, and an associated method of thermal management, such that an optimum capacity for energy transfer is obtained between the optical element and a material at a reference temperature.

By "optimum" is meant "allowing adjustment of the temperature of the optical element to a required optimum value".

This aim is achieved with a device for the thermal management of an optical element.

The device according to the invention comprises:
the optical element;
a material at a reference temperature; and
an intermediate gas layer positioned directly between the material at a reference temperature and the optical element, said intermediate gas layer being, over at least a proportion of its thickness, under diffusion conditions known as "transient", defined by a thickness of the intermediate gas layer such that the ratio of the mean free path of the gas molecules in the intermediate gas layer to said thickness is comprised between 0.1 and 10 (inclusive).

Hereinafter, this can simply be called "transient conditions".

An optical element is defined as any element that can alter the direction of propagation, amplitude, phase, wavelength or polarization of an electromagnetic wave, as well as any element that can generate an electromagnetic wave.

This electromagnetic wave can advantageously have a wavelength comprised between $10^{-8}$ m and $10^{-3}$ m.

Preferably, the intermediate gas layer is under transient diffusion conditions at least at the coldest of the interface with the material at a reference temperature and the interface with the optical element.

The intermediate gas layer can be under transient diffusion conditions starting from said coldest interface, over at least a proportion of its thickness in the direction towards the other interface.

This thickness can for example be comprised between 80% and 98% of the total thickness of the intermediate gas layer.

"Transient" conditions denotes the conditions in which the thermal exchanges in the intermediate gas layer occur preferentially through the collisions of the gas molecules with the walls of the container of the layer rather than through the collisions of the gas molecules with one another.

These conditions are called transient, since they are positioned between:
so-called "molecular" conditions in which the thermal exchanges in the intermediate gas layer occur preferentially through the collisions of the gas molecules with one another; and
conditions in which the thermal exchanges in the intermediate gas layer occur almost exclusively (for example over 90%) through the collisions of the gas molecules with the walls of the container of the gas layer.

Under these transient conditions, the thermal conductivity of the intermediate gas layer depends in particular on the thickness of the intermediate gas layer, its pressure and its temperature.

The intermediate gas layer is advantageously in direct contact, over an entire respective contact surface, on one side with the material at a reference temperature and on the other with the optical element.

The thermal conductivity of the intermediate gas layer can define a thermal flux between the optical element and the material at a reference temperature, via the intermediate gas layer.

In this way, a device is produced that is particularly adaptable for the thermal management of an optical element, since the ability of the intermediate gas layer to alter the temperature of the optical element can be controlled by these various parameters.

This is referred to as a material at a reference temperature, because it is the temperature of this material in particular that determines whether heat exchange with the optical medium takes place in one direction or in the other.

The intermediate gas layer does not require a specific flow circuit, as it does not have the purpose of energy removal. Its role is to transfer energy between the optical element and the material at a reference temperature.

Thus, a device is produced that is particularly simple to implement for the thermal management of an optical element.

Thus, a mechanically stable device is produced for the thermal management of an optical element.

The mean free path of a molecule represents the mean distance traveled by a particle between two collisions.

The mean free path $\Lambda$ of the gas molecules can be defined by the following formula:

$$\Lambda = \frac{1}{\sqrt{2}\,\pi d^2 \left(\frac{p}{k_B T}\right)}$$

where
p is the pressure in pascal (Pa);
T is the temperature in kelvin (K);
$k_B$ is the Boltzmann constant;
d is the diameter of the molecules in meters (m).

A local thickness of the intermediate gas layer can be defined: the thickness of this layer can vary depending on the locations on this layer, as long as transient conditions are met.

The double inequation of the transient conditions is verified in particular for small values of thickness and of pressure of the intermediate gas layer.

The thickness of the intermediate gas layer can be comprised between 10 µm and 5 mm.

The thickness of the intermediate gas layer can more precisely be comprised between 10 µm and 1000 µm.

The pressure in the intermediate gas layer can be comprised between 1 Pa and $10^5$ Pa.

It can be envisaged that the pressure is more particularly comprised between 500 Pa and 5000 Pa, to obtain improved properties of adaptability (a small change in a parameter then causing a large change in the thermal conductivity of the intermediate gas layer).

The intermediate layer is formed by a gas, and can be at a pressure below $10^5$ Pa.

A device is thus obtained for the thermal management of an optical element which preserves the integrity of the optical element, as well as of any treatment that might be deposited on said element.

The optical element can comprise at least one element from:
a gain medium (in particular a conventional gain medium or a non-linear gain medium);
a non-linear frequency conversion medium;
a multi-refractive medium (in particular a birefringent medium);
a medium acting on the polarization;
a dioptric element;
a catoptric element; or
a semiconducting medium.

It can therefore be seen that the optical element can in particular be a light source such as a light-emitting diode or laser.

Throughout the text, a gain medium denotes more particularly an optical gain medium.

The optical element can be a solid such as a glass, a crystal, a ceramic, a semiconductor.

The optical element can also be a gas or a liquid contained in a container (for example a glass bulb).

The spectral width of the emission lines of solid gain media depends on the temperature of the solid gain medium.

Laser beams can therefore be obtained the emitted linewidth of which is controlled precisely, in a laser system incorporating a device according to the invention, in which the optical element is the solid gain medium of the laser system.

Some of these elements can be the site of heating, in particular by partial absorption of the light on which they act. Moreover, as the efficiency of light sources is not perfect, they too heat up.

The device according to the invention then allows the optical element to be cooled.

Some of these elements must be heated in order to function optimally. This may be the case for example for non-linear frequency conversion media, which are heated in order to satisfy phase tuning connected with a narrow thermal acceptance.

The device according to the invention thus makes it possible to heat the optical element.

The intermediate gas layer can be confined in a closed space.

Recourse to a complicated system for gas circulation is thus avoided.

It is also possible to ensure good uniformity of pressure throughout the intermediate gas layer.

The closed space can be connected to a gas supply for compensating any leaks.

In fact, a closed space is not generally completely hermetic, hence the usefulness of said gas supply.

A low level of circulation can also be provided, going beyond what is necessary to compensate any leaks.

The circulation of gas in the intermediate gas layer is preferably very slight. The gas flow in the intermediate gas layer is for example less than 3% of the total volume of the intermediate gas layer per second.

According to a particularly advantageous embodiment, the material at a reference temperature has a temperature below 200 K (kelvin), and the optical element is a solid gain medium cooled by the material at a reference temperature (via the intermediate gas layer).

The solid gain medium can be cooled to a temperature below ambient temperature (300 K): its thermal conductivity is higher than at ambient temperature. A device can thus be produced for very efficient thermal management of an optical element.

In this temperature range, the effective absorption and emission cross-sections of an optical element formed by a solid gain medium are high.

It is thus possible to increase the energy efficiency of a laser system incorporating a device according to the invention, where the optical element is the solid gain medium of the laser system.

It is thus possible to reduce the investment in terms of optical pumping illumination (flash source, laser, diode, etc.) in a laser system incorporating a device according to the invention, where the optical element is the solid gain medium of the laser system.

The intermediate gas layer advantageously is constituted by helium to at least 90%.

Helium is a gas with very high thermal conductivity.

It is thus a good heat-transfer fluid.

Moreover, helium is a very light gas.

Perturbations connected with turbulence in the intermediate gas layer are thus limited.

Perturbations on a light beam passing through the intermediate gas layer are thus limited.

The intermediate gas layer can comprise any other gas, and in particular a mixture of several gases.

The optical element can be a gain medium that is arranged to produce a laser beam with a surface energy density (may be called fluence) equal to at least 10 J/cm$^2$.

The laser emission can be continuous or pulsed.

In the case of pulsed emission, the pulses can for example have an energy equal to at least 10 J.

The gain medium can be activated by optical pumping means.

The gain medium can be placed within a cavity resonating at an emission wavelength of said gain medium.

The gain medium can be used as a single-pass or multipass laser amplifier.

As the device according to the invention has very good capabilities for heat removal, it is particularly suitable for cooling a gain medium used for producing an energetic light beam.

According to a preferred embodiment, the device according to the invention comprises at least one control means from:
- a control means of the thickness of the intermediate gas layer;
- a control means of the pressure in the intermediate gas layer;
- a control means of the temperature of the material at a reference temperature.

These control means form means for adjusting and altering the temperature of the optical medium.

The thermal conductivity of the intermediate gas layer can in fact be changed by altering at least one parameter from:
- the thickness of the intermediate gas layer;
- the pressure in the intermediate gas layer;
- the temperature of the material at a reference temperature (which makes it possible to change the temperature of the intermediate gas layer).

Thus, a device is produced for dynamic thermal management. It is possible to adjust, using at least one control means, the capacity of the intermediate gas layer for transferring energy between the optical element and the material at a specified temperature, which defines the temperature of the optical element.

This change can take place in particular while the optical element is in use, or between two uses under different conditions.

It may be desired for example to keep the temperature of the gain medium constant, whatever the mean emission power, in a laser system incorporating a device according to the invention, where the optical element is the gain medium. In a laser system under pulsed conditions, a change in the mean emission power can correspond to a change in the pulse emission rate or the pulse energy.

Particularly advantageously, the device according to said preferred embodiment of the invention comprises at least one control means for locally controlling the thickness of the intermediate gas layer, the pressure in the intermediate gas layer and/or the temperature of the material at a reference temperature.

By "locally" is meant that the control can vary depending on the location in the plane defined by the intermediate gas layer.

Thus, a device is produced for dynamic thermal management, which can adapt to local inhomogeneities of the conditions of use of said device.

The device according to said preferred embodiment of the invention can comprise feedback means acting on at least one control means as a function of at least one measurement representative of the temperature of the optical element.

The measurement representative of the temperature of the optical element can be a direct measurement: measurement of the temperature, for example at the surface of the optical element.

The measurement representative of the temperature of the optical element can be an indirect measurement, in particular a measurement of:
- the phase distribution of a light wave called a "probe" passing through or being reflected on the optical element, and for which the phase distribution is known before having reached the optical element;
- the phase distribution of a light wave emitted by the optical element;
- the phase distribution of a light wave the direction of propagation, amplitude, phase, wavelength or polarization of which is altered by the optical element;
- the gain distribution if the optical element is a gain medium
- the physical deformation of the optical element (for example using sensor elements).

It is thus possible to achieve a closed-loop control, preferably in real time, of the temperature of the optical element, so as to set the latter at any moment at a desired value.

According to said preferred embodiment of the invention, the device according to the invention comprises means for altering a usage rate of the optical element.

The usage rate can be comprised between continuous use, and use for obtaining a single pulse (single-shot).

More particularly, the usage rate can be comprised between 1 Hz and 10 Hz.

A change in the usage rate of the optical element leads to a change in its temperature. This change can be compensated by means of at least one control means.

Advantageously, the optical element has a face covered with a highly reflective treatment (for example reflectivity above 99.5% at the wavelength of the reflected wave) and the intermediate gas layer is in direct contact with said face.

The highly reflective treatment is then considered to form part of the optical element.

Such an arrangement can correspond to disk lasers, also called "active mirrors", the intermediate gas layer being situated on the side with the treatment reflecting at the pumping and emission laser wavelengths, so as not to perturb the associated light beams entering and leaving the optical element constituted by the gain medium.

Thus, cooling having the aforementioned advantages is carried out, so that the highly reflective treatment is not subjected to any destructive stress.

The invention also relates to a method of thermal management, for the thermal management of an optical element used in a device according to the invention.

According to this method, an intermediate gas layer is used, positioned directly between a material at a reference temperature and the optical element, said intermediate gas layer being, over at least a proportion of its thickness, under diffusion conditions known as "transient" defined by a thickness of the intermediate gas layer such that the ratio of the mean free path of the gas molecules in the intermediate gas layer to said thickness is comprised between 0.1 and 10 (inclusive).

The technical effects and advantages mentioned with regard to the device according to the invention also arise in the method according to the invention.

The ratio of the mean free path of the gas molecules in the intermediate gas layer to the thickness of the intermediate gas layer can be selected, comprised between 0.1 and 10 (inclusive).

Advantageously, at least one of the following parameters is controlled:
the pressure in the intermediate gas layer;
the thickness of the intermediate gas layer;
the temperature of the material at a reference temperature;
so as to control the temperature of the optical element.

This control can be local, i.e. as a function of the location in the plane defined by the intermediate gas layer.

Feedback can be used for acting on at least one control parameter as a function of at least one measurement representative of the temperature of the optical element.

Preferably, at least one of the following parameters is controlled:
the pressure in the intermediate gas layer;
the thickness of the intermediate gas layer;
the temperature of the material at a reference temperature;
as a function of a usage rate of the optical element.

Thus, in particular a temperature of the optical element can be kept constant, whatever its usage rate.

The method according to the invention can be used for implementing a heat transfer comprised between 1 mW/cm$^2$ and 50 W/cm$^2$, between the optical element and the material at a reference temperature, via the intermediate gas layer.

In particular, the method according to the invention can be used for implementing a heat transfer comprised between 1 W/cm$^2$ and 10 W/cm$^2$, between the optical element and the material at a reference temperature, via the intermediate gas layer.

The optical element can be for example a gain medium arranged for producing a laser beam and requiring the removal of a thermal flux defined by a power density comprised between 1 W/cm$^2$ and 10 W/cm$^2$.

BRIEF DESCRIPTION OF THE DRAWINGS

Other advantages and characteristics of the invention will become apparent on examination of the detailed description of an embodiment which is in no way limitative, and the attached diagrams, in which:

FIG. 1 shows schematically a device according to the invention;

FIG. 2 shows a first embodiment of a device according to the invention;

FIG. 3A shows a graph of thermal conductivities as a function of the pressure in an intermediate gas layer of a device according to the invention, and for different thicknesses and temperatures of said layer;

Figure 3B:
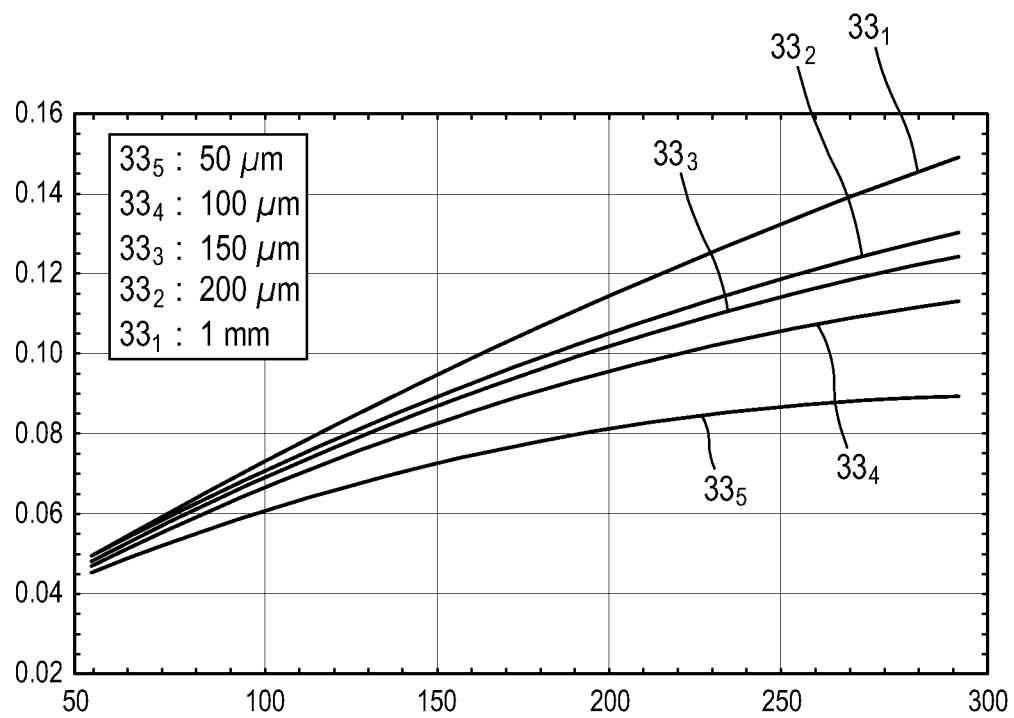
FIG. 3B shows a graph of thermal conductivities as a function of the temperature in an intermediate gas layer of a device according to the invention, and for different thicknesses of said layer.

The description of the device according to the invention will also serve to illustrate the method according to the invention.

DETAILED DESCRIPTION

First, the device 1 according to the invention will be described schematically, referring to FIG. 1.

The device 1 according to the invention comprises an optical element 2 the temperature of which it is desired to control.

The optical element 2 can be formed by:
a non-linear frequency conversion medium such as a crystal of D-KDP (deuterated potassium dihydrogen phosphate) or a crystal of lithium niobate, which can be used in a frequency doubler or frequency adding device for example;
a "conventional" gain medium that can be used in a cavity or a laser amplifier, such as a crystal of Yb (ytterbium)-doped YAG (yttrium aluminium garnet) or its ceramic equivalent obtained for example by sintering, a doped glass, a crystal of doped CaF$_2$ (fluorite), etc;
a non-linear gain medium such as BBO (beta-barium borate), which can form:
with a resonant cavity, an optical parametric oscillator (OPO);
an optical parametric amplifier (OPA)
an optical parametric chirped-pulse amplifier (OPCPA)
a medium acting on the polarization, such as a crystal of lithium niobate, which can be used in a Pockels cell;
a multi-refractive medium such as a crystal of TGG (terbium gallium garnet), which can be used in a Faraday rotator;
a dioptric element such as an optical lens or a viewing window;
a catadioptric element such as an optical mirror;
a semiconducting element such as a light-emitting diode or a laser diode;
etc.

The optical element 2 is in direct contact, on a contact surface 3, with an intermediate gas layer 4.

The contact surface 3, as shown, is plane, but this is not the general case. Any shape can be envisaged.

The intermediate layer can be formed by a gas such as helium, which has the advantage of offering very good thermal conductivity and of being a light gas forming little atmospheric turbulence which is likely to perturb a light beam passing through the intermediate gas layer 4.

The intermediate gas layer 4 can also be formed by any other gas or mixture of several gases (nitrogen, air, etc.).

The intermediate gas layer 4 is in contact on one side with the optical element 2, and on the other with the material 5 at a reference temperature.

The material 5 at a reference temperature can be formed by a metal such as copper, or by a crystal such as a diamond or sapphire (especially in the case when working in transmission, i.e. when it is desired to use a light beam after passage through the optical element 2 and then the intermediate gas layer 4).

The material 5 at a reference temperature can also be liquid or even a gas.

The intermediate gas layer 4 is under transient conditions in which the thermal exchanges occur preferentially via molecular collisions with the walls of the intermediate gas layer 4.

For transient conditions to be satisfied, it is necessary for the probability of encountering a wall to be higher than that of encountering another molecule.

For each thickness of the intermediate gas layer 4, at a given temperature and for a given gas composition there is a maximum pressure that is not to be exceeded.

The conditions of temperature, pressure and thickness are satisfied, for the gas composition of the intermediate gas layer, so that in at least 90% of the thickness of the intermediate gas layer 4, the ratio of the mean free path of the gas molecules to the thickness of said layer is comprised between 0.1 and 10.

The intermediate gas layer can be situated under transient conditions in which this ratio is comprised between 0.1 and 10, except on a very thin lamella, at the interface with a very hot material, for example the optical element 2.

The intermediate gas layer 4 can have a thickness comprised between 10 μm and 5 mm.

The intermediate gas layer 4 can have a gas pressure comprised between 1 Pa and $10^5$ Pa.

Under these transient conditions, the thermal conductivity of the gas forming the intermediate gas layer 4 then depends on the temperature, pressure and geometry of the space containing this layer, according to the following formula:

$$k(T) = f(T, L, p) = k_{bulk}(T) \cdot \left(1 + \frac{8}{3} \cdot \frac{\alpha k_{bulk}(T) \cdot T}{L \cdot p \cdot \sqrt{3 \cdot R \cdot T}}\right)^{-1},$$

where k(T) is the thermal conductivity of the intermediate gas layer 4 at pressure p and at temperature T;

$k_{bulk}(T)$ is the thermal conductivity of the intermediate gas layer 4 at atmospheric pressure and at temperature T;

T is the temperature in K (kelvin) in the intermediate gas layer 4 (related to the temperature of the material 5 at a reference temperature);

p is the pressure in Pa (pascal) in the intermediate gas layer 4;

R is a constant of the gas forming the intermediate gas layer 4;

L is the thickness of the intermediate gas layer 4;

α is a thermal adjustment factor connected with the nature of the gas used (monatomic, diatomic, etc.) and with the interactions between this gas and the materials constituting the optical element and the material at a reference temperature, which will be fixed at 4 for the physical cases in the graphs shown in FIGS. 3A, 3B, 4, 5A and 5B.

The device 1 according to the invention is therefore adaptable: as a function of an amount of energy that it is desired to transfer between the optical element 2 and the material 5, via the intermediate gas layer 4, and for a given composition of the gas in the intermediate gas layer 4, the three parameters p, L, and T are fixed for the intermediate gas layer 4.

It may for example be desired to preserve the temperature of the optical element 2 and for this:

fix L and the temperature of the material 5, and adjust p, or fix p and the temperature of the material 5, and adjust L, or fix p and L, and adjust the temperature of the material 5.

Each of the parameters can be expressed as a function of x and y coordinates corresponding to a position on the surface of the intermediate gas layer 4 (as opposed to the position in the dimension z of the thickness of the intermediate gas layer 4).

A first embodiment of the device 1 according to the invention will now be described, with reference to FIG. 2.

According to this embodiment, the device 1 according to the invention is placed in an enclosure 20 under vacuum provided by vacuum pump 21. In particular any condensation on the face of the optical element 2, on the side opposite the intermediate gas layer 4 is thus avoided.

This enclosure 20 is only required in the event it is desired to bring the optical element 2 to a temperature below the dew point of the environment.

A vacuum window 22 can allow a light beam to pass into the enclosure 20, for example a pump beam when the optical element 2 is formed by a gain medium.

In the example shown in FIG. 2, the optical element 2 operates in reflection, with all the light beams passing through the vacuum window 22.

The thickness of the intermediate gas layer 4 is determined by the height of the blocks 23 (for example Teflon or polyimide blocks).

The intermediate gas layer 4 is formed from helium and it is connected to a helium supply 26 so as to compensate the losses in the closed space 25 formed between the optical element 2, material 5 at a reference temperature, and the blocks 23.

The material 5 at a reference temperature is formed by copper metal maintained at 77 K by a liquid nitrogen chamber 24 connected to a cooling loop (not shown).

It is thus possible to obtain temperatures of the order of 160 K in the optical element 2.

These low temperatures are of benefit in particular when the optical element 2 is a solid gain medium.

The thermal conductivity of certain solids such as gain media increases as their temperature decreases. The device 1 according to the invention is then particularly effective for cooling the optical element 2.

At these temperatures, the effective absorption and emission cross-sections of the gain media are increased. The energy efficiency of a laser is thus increased and the capital expenditure on pumping illumination, for example on a pump diode, can be reduced for example by a factor of three.

The emission lines of the gain media become finer as the temperature decreases, and their width depends on the temperature of the gain medium: the spectral width of the laser emission wavelength can be controlled precisely.

It is also possible to use a chamber of liquid helium rather than of liquid nitrogen, or any other refrigerant, for example water at 280 K if it is not desired to cool to cryogenic temperatures.

The conditions of temperature, pressure and thickness are satisfied such that the ratio of the mean free path of the gas molecules to the thickness of said layer, in at least 95% of the thickness of the intermediate gas layer 4, is comprised between 0.1 and 10.

The thermal conductivity of the gas forming the intermediate gas layer 4 will now be examined more closely.

The temperature in the intermediate gas layer can have a gradient, from the interface with the material 5 at a reference temperature to the interface with the optical element 2.

In FIGS. 3A and 3B, it is assumed that there is no temperature gradient in the intermediate gas layer 4 from the interface with the material 5 at a reference temperature to the interface with the optical element 2. The temperature is assumed to be the same everywhere: on the surfaces of the cell and within the gas.

FIG. 3A shows a graph of thermal conductivities of the intermediate gas layer 4, as a function of the pressure in the latter, and for different thicknesses and temperatures of the latter, when it is formed from helium.

The abscissa corresponds to pressure in pascal, on a logarithmic scale.

The ordinate corresponds to thermal conductivity in watts per meter per kelvin, on a logarithmic scale.

The curves drawn with a solid line $30_1$, $30_2$, $30_3$ represent respectively the thermal conductivity as a function of the pressure in an intermediate gas layer 4 having a thickness of 200 µm, 150 µm and 100 µm, at 160 K.

The curves drawn with a dashed line $31_1$, $31_2$, $31_3$ represent respectively the thermal conductivity as a function of the pressure in an intermediate gas layer 4 having a thickness of 200 µm, 150 µm and 100 µm, at 300 K.

It can be seen that the device 1 according to the invention is usable at all temperatures, in particular from "ambient" temperatures (around 300 K) to low temperatures (for example around 160 K, but the device 1 according to the invention can also be used at even lower temperatures, for example 4 K).

For a pressure in the range from $10^3$ to $10^4$ Pa, and for the temperatures and thicknesses taken as examples, transient diffusion conditions obtain over at least 80% of the thickness of the intermediate gas layer 4.

It can be seen that for a pressure in the range from $10^3$ to $10^4$ Pa, the thermal conductivity of the intermediate gas layer 4 varies considerably as a function of the pressure.

It can be seen that the thermal conductivity of the intermediate gas layer 4 varies with its thickness (here between 100 µm and 200 µm).

It is therefore possible, by altering the pressure in said intermediate gas layer 4, to obtain a desired thermal conductivity.

It is therefore possible, by altering the thickness of said intermediate gas layer 4, to obtain a desired thermal conductivity.

This thermal conductivity is related to an amount of heat that can be exchanged between the optical element 2 and the material 5, via the intermediate gas layer 4.

It is therefore related to the temperature of the optical element 2 that it is desired to reach.

Each of the parameters of the graph in FIG. 3A (in particular the thickness L of the intermediate gas layer 4, its pressure p and its temperature T) can be expressed as a function of x and y coordinates corresponding to a position on the surface of the intermediate gas layer 4. A different thermal conductivity can therefore be envisaged as a function of the position on the intermediate gas layer 4.

It is thus possible to adapt to different conditions as a function of the position on the intermediate gas layer 4.

In particular, if an amount of energy arriving on a point of the optical element 2 differs according to the surface position on the optical element 2, the intermediate gas layer 4 can be adjusted so that a perfectly uniform temperature is nevertheless obtained throughout the optical element.

FIG. 3B illustrates more particularly the fact that the device 1 according to the invention is usable over a temperature range, for example from 160 K to the temperature known as "ambient" (around 300 K).

The abscissa corresponds to a temperature in K (kelvin) in the intermediate gas layer 4.

The ordinate corresponds to a thermal conductivity of the intermediate gas layer 4, in watts per meter per kelvin.

The curves $33_1$, $33_2$, $33_3$, $33_4$ and $33_5$ represent respectively the thermal conductivity of the intermediate gas layer 4 as a function of its temperature, and for thicknesses of 1000 µm, 200 µm, 150 µm, 100 µm and 50 µm, at $10^4$ Pa.

The intermediate gas layer is formed from helium.

For the entire range of temperatures and thicknesses shown, and for a pressure of $10^4$ Pa, transient diffusion conditions obtain over at least 80% of the thickness of the intermediate gas layer 4.

It can be seen that the thermal conductivity of the intermediate gas layer 4 varies considerably as a function of its temperature, varying for example between 50 K and 300 K.

Figure 4:
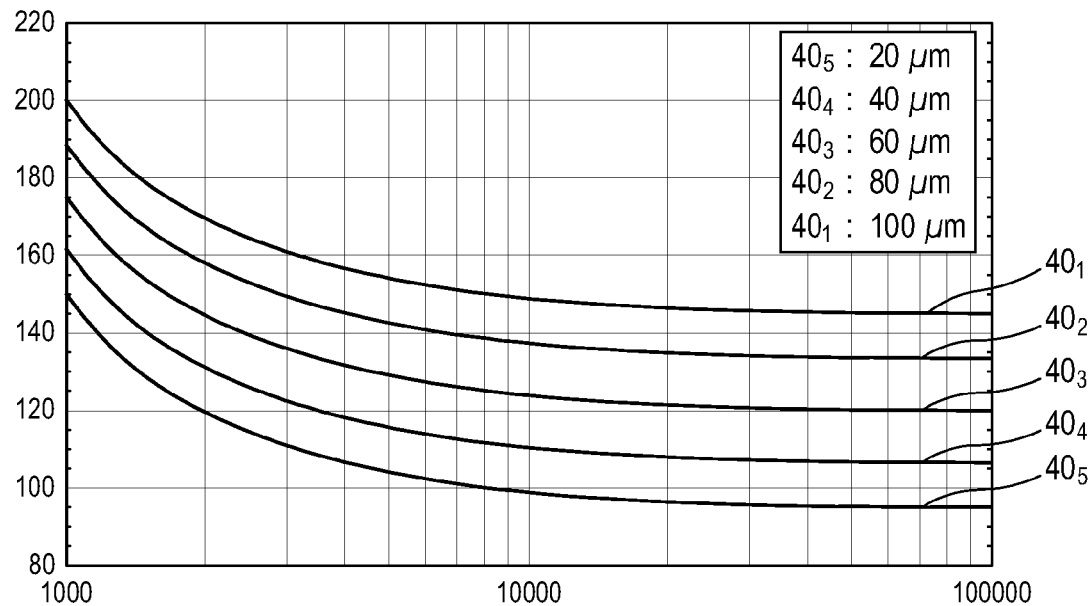
FIG. 4 shows a graph of temperatures of the optical element, as a function of the pressure in the intermediate gas layer in a device according to the invention and for different thicknesses of the latter.

FIG. 4 shows curves of temperature in the optical element 2, in particular on the contact surface 3 between the optical element 2 and the intermediate gas layer 4, as a function of the pressure in the intermediate gas layer 4, for a device 1 according to the invention, and for different thicknesses of said layer 4.

The device 1 according to the invention is that shown in FIG. 2, the material 5 being maintained at 77 K.

The thermal flux between the optical element 2 and the intermediate gas layer 4 is 5 W/cm² for all the points of the curves.

The abscissa corresponds to a pressure in pascal, on a logarithmic scale.

The ordinate corresponds to a temperature in kelvin.

The curves $40_1$, $40_2$, $40_3$, $40_4$ and $40_5$ represent respectively the temperature on the contact surface 3 as a function of the pressure in the intermediate gas layer 4, for a thickness of said layer of 100 µm, 80 µm, 60 µm, 40 µm and 20 µm.

The intermediate gas layer is formed from helium.

For a pressure in the range from $10^3$ to $10^4$ Pa, and for the thicknesses taken as examples, transient diffusion conditions obtain over at least 80% of the thickness of the intermediate gas layer 4.

It can be seen that small thicknesses for the intermediate gas layer 4 make it possible to reach, at equal pressure in the intermediate gas layer 4, lower temperatures on the contact surface 3.

For example, thicknesses for example of the order of about ten micrometers are preferred, if the objective is a cryogenic temperature (i.e. below 120 K) in the optical element 2.

It can be seen that under the transient conditions obtained in the device 1 according to the invention, it is possible, in order to obtain a desired temperature of the contact surface 3, and for a given composition of the intermediate gas layer 4 and a given temperature of the material 5 at a reference temperature, to fix the pressure in the intermediate gas layer 4 and adjust the thickness of said layer. It is also possible to fix the thickness of the intermediate gas layer 4 and adjust the pressure in said layer 4.

It can also be seen that for a pressure comprised between $10^3$ Pa and $10^4$ Pa, there is considerable sensitivity of the temperature of the optical element 2 as a function of the pressure in the intermediate gas layer 4.

Figure 5B:
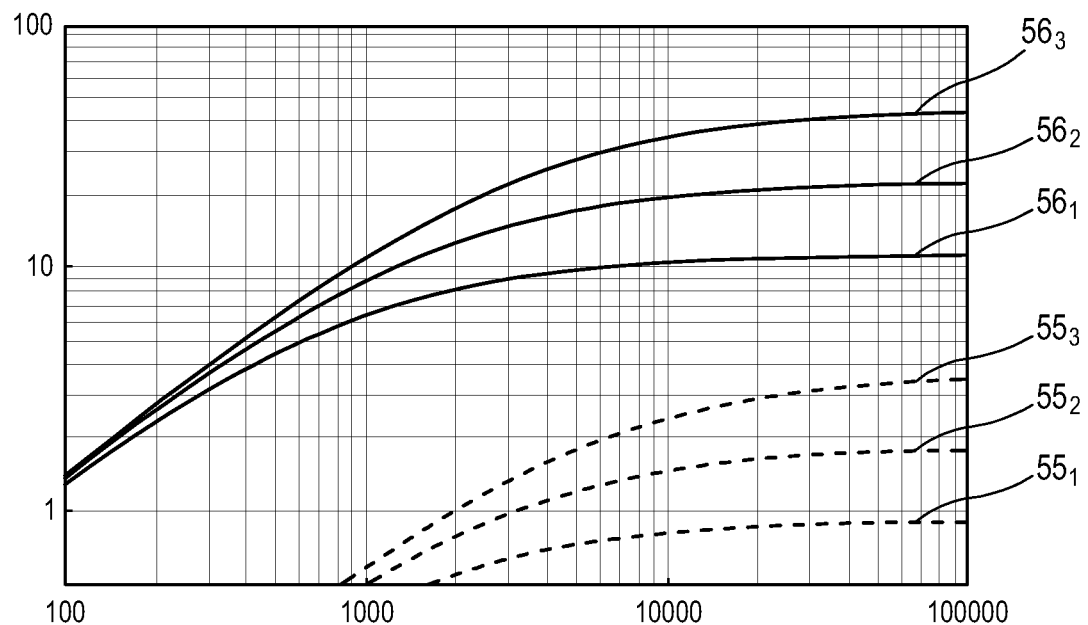
FIG. 5B shows a graph of heat transfers as a function of the pressure in an intermediate gas layer of a device according to the invention, for different thicknesses of said layer and for two temperatures of the material at a reference temperature.
Figure 5A:
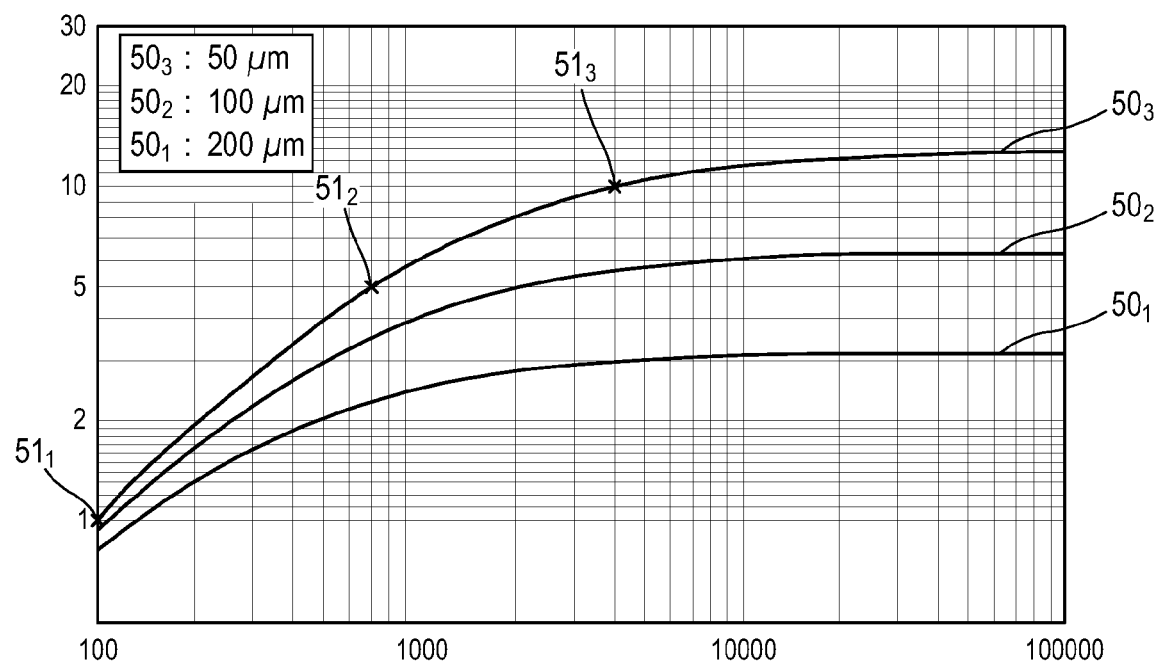
FIG. 5A shows a graph of heat transfers as a function of the pressure in an intermediate gas layer of a device according to the invention, and for different thicknesses of said layer.

FIG. 5A shows a graph of heat transfers between the optical element 2 and the material 5, passing through the intermediate gas layer 4, as a function of the pressure in the intermediate gas layer 4, and for different thicknesses of said layer 4.

The heat transfer depends in particular on the thermal conductivity of the intermediate gas layer and of the optical element 2.

The heat transfer was calculated in the particular case of the transient conditions obtained in a device 1 according to the invention (see article by Y. Demirel and S. C. Saxena, "Heat transfer through a low-pressure gas enclosure as a thermal insulator: design considerations", Int. Journ. of Energy Research 20, 327-338 (1996)).

The material 5 at a reference temperature is maintained at 77 K.

The optical element 2 is a gain medium at 160 K.

The temperature of the intermediate gas layer varies from 160 K at the interface with the optical element 2, to 77K at the interface with the material 5 at a reference temperature.

The abscissa corresponds to a pressure in pascal, on a logarithmic scale.

The ordinate corresponds to the thermal flux between the optical element 2 and the material 5 at a reference temperature, passing through the intermediate gas layer 4, in W/cm$^2$ and on a logarithmic scale.

The curves $50_1$, $50_2$ and $50_3$ represent respectively said thermal flux as a function of the pressure in the intermediate gas layer 4, for a thickness of said layer of 200 μm, 100 μm and 50 μm.

The intermediate gas layer is formed from helium.

For a pressure in the range from $10^2$ to $10^4$ Pa, and for the thicknesses taken as examples, transient diffusion conditions obtain over at least 80% of the thickness of the intermediate gas layer 4.

It can be seen that under the transient conditions obtained in the device 1 according to the invention, to obtain a given heat transfer between the optical element 2 and the material 5 at a reference temperature, passing through the intermediate gas layer 4 (for a given gas composition):

The pressure and the temperature in the intermediate gas layer 4 can be fixed (in particular the temperature at the interface with the material 5 at a reference temperature) and the thickness of said layer adjusted;

The thickness and the temperature of the intermediate gas layer 4 can be fixed (in particular the temperature at the interface with the material 5 at a reference temperature) and the pressure in said layer 4 adjusted.

For a desired temperature in the optical element 2, the heat transfer is controlled between the optical element 2 and the material 5 at a reference temperature, passing through the intermediate gas layer 4.

The greater the cooling or heating of the optical element 2 that is required, the more the heat transfer must be increased.

FIG. 5B compares heat transfers between the optical element 2 and the material 5 at a reference temperature, passing through the intermediate gas layer 4, as a function of the pressure in the intermediate gas layer 4 and for different thicknesses of said layer 4.

The optical element 2 is a gain medium at 293 K, i.e. ambient temperature.

The curves $55_1$, $55_2$ and $55_3$ represent respectively the thermal flux between the optical element 2 and the material 5 at a reference temperature, passing through the intermediate gas layer 4, as a function of the pressure in the intermediate gas layer 4, for a thickness of said layer of 200 μm, 100 μm and 50 μm, and for a temperature of the material 5 at a reference temperature of 280 K, i.e. the temperature of cold water.

The curves $56_1$, $56_2$ and $56_3$ represent respectively the thermal flux between the optical element 2 and the material 5 at a reference temperature, passing through the intermediate gas layer 4, as a function of the pressure in the intermediate gas layer 4, for a thickness of said layer of 200 μm, 100 μm and 50 μm, and for a temperature of the material 5 at a reference temperature of 77 K, or the temperature of liquid nitrogen.

The intermediate gas layer is formed from helium.

For a pressure ranging from about $10^2$ to $10^4$ Pa, or $10^3$ to $10^5$ Pa respectively (from $10^2$ to $10^3$ Pa, the corresponding curves are not shown in the figure), and for the thicknesses taken as examples, transient diffusion conditions obtain over at least 80% of the thickness of the intermediate gas layer 4.

It is shown that even if the device 1 according to the invention is as effective at ambient temperature as at low temperatures, the maximum attainable heat transfer is higher in the case of low temperatures, which therefore permit more effective cooling.

The properties of adjustability, which are illustrated in particular with reference to FIGS. 3A to 5B, offer an advantage, in particular when it is desired to alter a usage rate of the optical element 2.

The optical element 2 is for example a gain medium of a high-power laser (delivering for example pulses of several hundreds of joules, up to several kilojoules).

The device 1 according to the invention provides particularly effective cooling, allowing the rate of such laser firings to be increased, passing for example from 1 Hz to 10 Hz (the pulse durations are for example of the order of a picosecond or nanosecond or femtosecond).

Moreover, the properties of adaptability of the device 1 according to the invention make it possible to alter the rate of the laser firings, during use, and while maintaining a constant temperature of the gain medium 2.

According to curve $50_3$ in FIG. 5A, if a pressure of 100 Pa is required for a laser firing rate of 1 Hz (point $51_1$), then for identical pulses there should obtain, for keeping the temperature of the gain medium 2 constant:

a pressure of $7 \cdot 10^2$ Pa for a laser firing rate of 5 Hz (point $51_2$), a pressure of $4 \cdot 10^3$ Pa for a laser firing rate of 10 Hz (point $51_3$).

Figure 6:
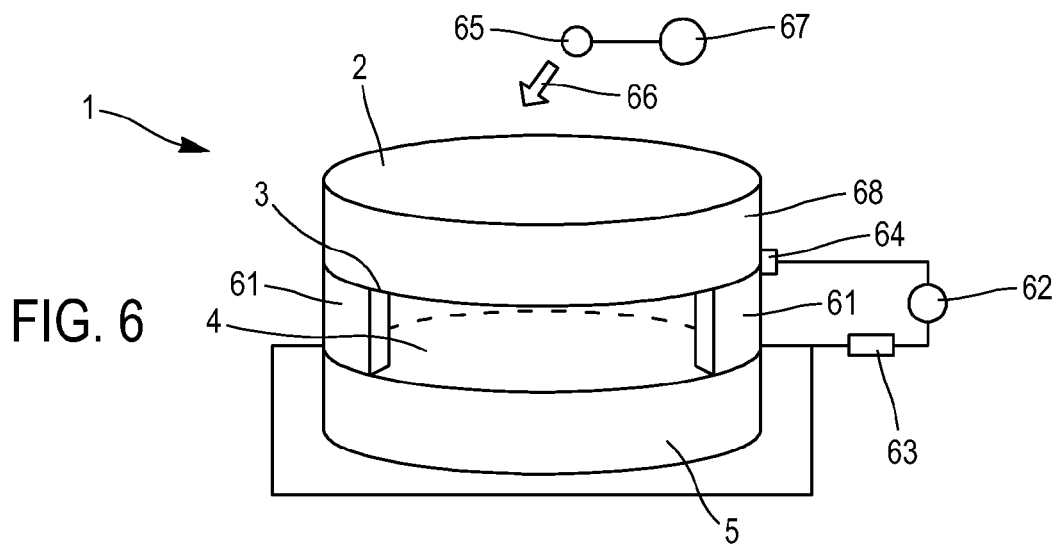
FIG. 6 shows a second embodiment of a device according to the invention.

FIG. 6 illustrates a second embodiment of device 1 according to the invention.

The optical element 2 is a gain medium.

It is for example YAG doped with ytterbium at a concentration of 0.15 at. % (atomic percentage), for emission in the near infrared.

Its dimensions are for example thickness of 2.6 cm for a surface area of 12.11×11.44 cm$^2$.

The intermediate gas layer 4 is a closed space of helium.

The material 5 at a reference temperature is a copper plate maintained at 77 K.

The gain medium 2 is thus maintained at 160 K.

The conditions of pressure and thickness are satisfied in such a way that the ratio of the mean free path of the gas molecules in at least 95% of the thickness of the intermediate gas layer 4 is comprised between 0.1 and 10.

The contact surface 3 comprises a treatment that is highly reflective (99.9%) at an emission wavelength of the gain medium 2, and is deposited on the latter.

The whole forms a disk laser (operation in reflection), pumped by at least one pump diode 65 positioned on the side of the gain medium 2 opposite the contact surface 3 (it is then called active surface).

The pump diode 65 emits a super-Gaussian pump beam 66 (a super-Gaussian can be defined by a function of the type $$f(x) = Ae^{-\left(\frac{x-b}{a}\right)^{n>2}})$$

with a duration of 0.7 ms and with illumination equal to 6 kW/cm² on a surface area of 11.11×10.44 cm².

About 4900 W of the pump beam 66 is absorbed by the gain medium 2, 10% of which is converted to heat.

The intermediate gas layer is therefore parameterized so as to be able to remove 490 W from the gain medium 2.

The laser beam is emitted from the side opposite the contact surface 3 comprising the highly reflective treatment.

An advantage of this embodiment is that neither the laser beam emitted, nor the pump beam 66 passes through the intermediate gas layer 4. The intermediate gas layer 4 therefore does not produce any optical perturbation.

Another advantage of this embodiment is that the highly reflective treatment is not in contact with a solid or a liquid such as a glue, which could be heated by absorbing the beam at the emission wavelength (for example 0.1% of absorption). The reflective treatment is thus protected against any degradation, in particular by additional overheating effects.

The device 1 according to the invention comprises means 67 for altering the rate of emission of the pump beam 66.

The thickness of the intermediate gas layer 4 can be altered by means of piezoelectric blocks 61, the thickness of which can be altered by the electrical supply 63.

The disk laser can therefore be used at different rates, different pump powers, etc., while easily maintaining a stable temperature of the gain medium 2.

The disk laser can be used for producing high-energy pulses (for example several hundreds of joules or even several kilojoules per pulse), owing to efficient cooling by the device 1 according to the invention.

It is thus possible to eliminate or limit drawbacks such as optical distortions:
  due to thermal gradients in the gain medium 2 (in particular thermal birefringence in the gain medium 2, or a thermal lens in the gain medium 2);
  due to the mechanical stress generated by the distribution of heat in the gain medium 2.

FIG. 6 also shows feedback means 62. The feedback means 62 act on the electrical supply 63 in relation to a direct or indirect measurement of the temperature on the contact surface 3 (side of optical element 2) measured by a sensor 64.

In FIG. 6, sensor 64 performs a direct measurement of the temperature of the optical element 2. However, indirect measurements may be preferred, in particular using phase information for a light beam passing through the optical element 2.

The feedback means 62 make it possible for example to keep constant, automatically and in real time, the temperature of the contact surface 3 (side of the optical element 2) and more generally of the optical element 2 (formed here by a gain medium). The operating conditions of the gain medium 2 are thus maintained (same mechanical stress, same thermal lens, same birefringence, etc.). The same emission laser beam quality and energy is thus maintained.

According to a variant that is not shown, the feedback means act on a vacuum pump to alter the pressure in the intermediate gas layer as a function of the temperature on the contact surface 3.

According to a variant that is not shown, the feedback means act on at least one heating resistance to alter the temperature of the material 5 at a reference temperature as a function of the temperature on the contact surface 3.

According to other variants, device 1 according to the invention is used in an optical fibre, or in any type of transport device, optical amplifier or optical oscillator.

It has been assumed here that the temperature at a point of the contact surface 3 corresponds to the temperature throughout the optical element 2.

It will be seen below that it is possible to consider the temperature at different points of the optical element (for example via the aforementioned phase measurements), in particular with a view to making the temperature uniform, by making it equal at all points of the optical element 2.

Figure 7:
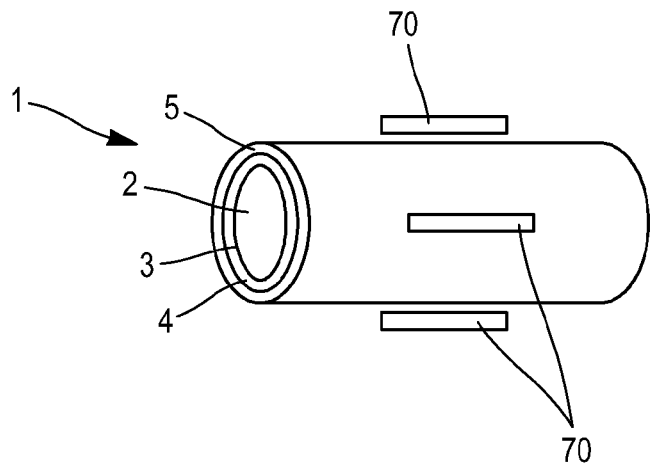
FIG. 7 shows a third embodiment of a device according to the invention.

FIG. 7 illustrates a third embodiment of device 1 according to the invention.

According to this third embodiment, the device 1 according to the invention is used in a cylindrical transport system (optical fibre) or a cylindrical amplifier (optical rod or fibre).

Starting from the centre of the fibre and moving outwards, the following are encountered successively:
  a gain medium 2;
  a contact surface 3;
  an intermediate gas layer 4 (for example helium); and
  a material 5 at a reference temperature.

The conditions of temperature, pressure and thickness of the intermediate gas layer 4 are satisfied in such a way that the ratio of the mean free path of the gas molecules in at least 95% of the thickness of the intermediate gas layer 4 is comprised between 0.1 and 10.

The gain medium 2 is pumped optically for example by pump diodes (or flash lamps, or another laser) 70 (three of these sources are shown in FIG. 7, and a fourth is located behind the device 1 according to the invention).

The gain medium 2 is therefore heated non-uniformly by the pump source, on the contact surface 3.

To rectify this non-uniform heating and nevertheless obtain a uniform temperature on the entire contact surface 3, the device 1 according to the invention is used, applying local variation of the temperature of the material 5 at a reference temperature, as a function of the heat distribution due to the pump diodes.

Locally varying the pressure in the intermediate gas layer 4 and/or the thickness of the intermediate gas layer 4 might also be considered.

For example, the temperature of the material 5 at a reference temperature can be altered locally by connecting it to heating resistances (not shown) distributed around the material 5 at a reference temperature.

Another source of inhomogeneity in the spatial distribution of the heat to be removed from an optical element 2 to keep the latter at a stable and uniform temperature can be the presence of an absorption material around a gain medium 2.

Such a material is called "cladding", and makes it possible to absorb the amplified spontaneous emission (ASE) in the gain medium.

Such a material surrounds the gain medium 2 laterally in a disk laser, as shown in FIG. 6 (the lateral surface of the gain medium 2 is referenced 68).

Figure 8:
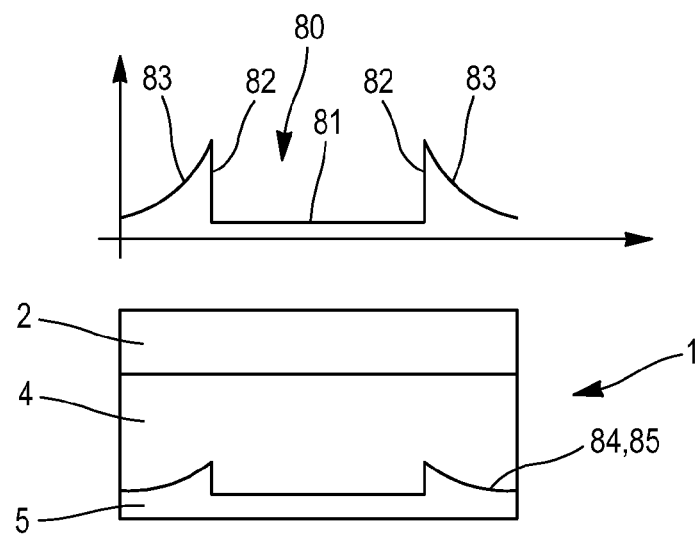
FIG. 8 shows the use of a fourth embodiment of a device according to the invention.

The curves in FIG. 8 are presented to show their trends, that is why the scales are not stated.

The curve 80 of heat distribution as a function of the position on an axis passing through the centre of an extended contact surface is shown at the top in FIG. 8.

The extended contact surface corresponds to the contact surface between the intermediate gas layer 4 on the one hand, and the assembly formed by the gain medium 2 and the absorption material on the other hand.

Curve 80 has a plateau 81, which corresponds to the contact surface between the intermediate gas layer 4 and the gain medium 2.

Curve 80 has two steps 82, which correspond to the interface between the gain medium 2 and the absorption material.

Curve 80 has two curve portions 83 that correspond to the contact surface between the intermediate gas layer 4 and the absorption medium (cladding).

FIG. 8 shows, at the bottom, with the same abscissa, a sectional view of the device 1 according to the invention enabling a temperature to be obtained that is equal at every point of the extended contact surface.

The properties of variation of the thermal conductivity of the intermediate gas layer 4 as a function of the thickness of the latter are utilized for this purpose.

Therefore a profile of the interface surface 84 between the intermediate gas layer 4 and the material 5 at a reference temperature is provided that is proportional to the distribution profile of the thermal load on the extended contact surface. In fact, FIG. 5A clearly shows that at constant pressure, a smaller thickness of gas layer will be required in order to remove more heat.

The interface surface 84 between the intermediate gas layer 4 and the material 5 at a reference temperature can be deformable and controlled so as to form, with controlling means that are not shown, a control means 85 for locally controlling the thickness of the intermediate gas layer.

It is also possible to envisage adapting the interface surface 84 in the same way to compensate the Gaussian or super-Gaussian shape of the pump beam incident on an optical element 2.

Of course, the invention is not limited to the examples that have just been described, and numerous adjustments can be made to these examples while remaining within the scope of the invention.

In particular, the principle described can be applied to any device, in particular any laser device, and for all energy ranges, regardless of the shape (plate, rod, mosaic etc.) of the gain medium.

The principle described can be applied to types of optical media other than gain media, if it is desired to be able to control their temperature.

The optical elements can be used at a specified rate, or continuously.

The invention claimed is:

1. A device for the thermal management of an optical element, comprising:
   the optical element;
   a material at a reference temperature;
   an intermediate gas layer positioned directly between the material at a reference temperature and the optical element; and
   said intermediate gas layer is, over at least a proportion of its thickness, under diffusion conditions known as "transient", defined by a thickness of the intermediate gas layer such that the ratio of the mean free path of the gas molecules in the intermediate gas layer to said thickness is comprised between 0.1 and 10, and in that the thickness of the intermediate gas layer is comprised between 10 µm and 5 mm.

2. The device according to claim 1, wherein the optical element comprises at least one element from:
   a gain medium;
   a non-linear frequency conversion medium;
   a multi-refractive medium;
   a medium acting on the polarization;
   a dioptric element;
   a catoptric element; or
   a semiconducting medium.

3. The device according to claim 1, wherein the intermediate gas layer is confined in a closed space.

4. The device according to claim 1, wherein the material at a reference temperature has a temperature below 200 K, and in that the optical element is a solid gain medium cooled by the material at a reference temperature.

5. The device according to claim 1, wherein the intermediate gas layer is constituted by helium to at least 90%.

6. The device according to claim 1, further comprising at least one control means from:
   a control means of the thickness of the intermediate gas layer;
   a control means of the pressure in the intermediate gas layer;
   a control means of the temperature of the material at a reference temperature.

7. The device according to claim 6, further comprising at least one control means for locally controlling the thickness of the intermediate gas layer, the pressure in the intermediate gas layer and/or the temperature of the material at a reference temperature.

8. The device according to claim 6, further comprising feedback means acting on at least one control means as a function of at least one measurement representative of the temperature of the optical element.

9. The device according to claim 6, further comprising means for altering a usage rate of the optical element.

10. The device according to claim 1, wherein the optical element has a face covered with a highly reflective treatment and in that the intermediate gas layer is in direct contact with said face.

11. A method of thermal management, for the thermal management of an optical element, used in a device according to claim 1, comprising: using an intermediate gas layer; positioning said layer directly between a material at a reference temperature and the optical element; said intermediate gas layer is, over at least a proportion of its thickness, under diffusion conditions known as "transient", defined by a thickness of the intermediate gas layer such that the ratio of the mean free path of the gas molecules in the intermediate gas layer to said thickness is comprised between 0.1 and 10, and in that the thickness of the intermediate gas layer is comprised between 10 µm and 5 mm.

12. The method of thermal management according to claim 11, characterized in that at least one of the following parameters is controlled:
   the pressure in the intermediate gas layer;
   the thickness of the intermediate gas layer; and
   the temperature of the material at a reference temperature;
   so as to control the temperature of the optical element.

13. The method of thermal management according to claim 11, characterized in that at least one of the following parameters is controlled:
   the pressure in the intermediate gas layer;
   the thickness of the intermediate gas layer;
   the temperature of the material at a reference temperature; and
   as a function of a usage rate of the optical element.

14. The method of thermal management according to claim 11, characterized in that it is used for implementing a heat transfer comprised between 1 mW/cm$^2$ and 50 W/cm$^2$, between the optical element and the material at a reference temperature, via the intermediate gas layer.

15. The device according to claim 1, further comprising a housing enclosing the optical element, said housing including a window aligned with the optical element.

\* \* \* \* \*